(12) United States Patent
Park et al.

(10) Patent No.: US 10,002,918 B2
(45) Date of Patent: Jun. 19, 2018

(54) DISPLAY SUBSTRATES, METHODS OF MANUFACTURING THE SAME AND DISPLAY DEVICES INCLUDING THE SAME

(71) Applicant: Samsung Display Co., Ltd., Yongin-si, Gyeonggi-do (KR)

(72) Inventors: Jun-Hong Park, Suwon-si (KR); Kyoung-Heon Lee, Cheonan-si (KR); Ji-Hyun Kim, Suwon-si (KR); Jeong-Min Park, Seoul (KR); Jung-Soo Lee, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/254,697

(22) Filed: Sep. 1, 2016

(65) Prior Publication Data
US 2017/0236892 A1    Aug. 17, 2017

(30) Foreign Application Priority Data
Feb. 16, 2016  (KR) .......... 10-2016-0017686

(51) Int. Cl.
*H01L 27/32* (2006.01)
*H01L 51/52* (2006.01)
*H01L 51/00* (2006.01)

(52) U.S. Cl.
CPC ...... *H01L 27/3279* (2013.01); *H01L 27/3258* (2013.01); *H01L 27/3276* (2013.01); *H01L 51/0023* (2013.01); *H01L 51/5284* (2013.01)

(58) Field of Classification Search
CPC ............ H01L 27/3246; H01L 27/3279; H01L 51/0023; H01L 51/5253; H01L 51/5284; H01L 51/56
See application file for complete search history.

(56) References Cited

U.S. PATENT DOCUMENTS

| | | | | |
|---|---|---|---|---|
| 2005/0178569 A1* | 8/2005 | Kotsubo | .............. | H05K 3/182 174/389 |
| 2012/0086093 A1* | 4/2012 | Otsuka | ............. | H01L 27/14621 257/432 |
| 2013/0038542 A1* | 2/2013 | Kim | ....................... | G06F 3/041 345/173 |
| 2017/0053973 A1* | 2/2017 | Park | .................. | H01L 27/3246 |
| 2017/0235173 A1* | 8/2017 | Katoh | .................. | G02F 1/1368 349/46 |

FOREIGN PATENT DOCUMENTS

| | | |
|---|---|---|
| KR | 10-2002-0002903 A | 1/2002 |
| KR | 10-2005-0002014 A | 1/2005 |

* cited by examiner

*Primary Examiner* — Allan R Wilson
(74) *Attorney, Agent, or Firm* — Knobbe Martens Olson & Bear LLP

(57) ABSTRACT

Display substrates, methods of manufacturing the same and display devices including the same disclosed. In one aspect, a display substrate includes a base substrate and a stack structure over the base substrate, the stack structure including an active pattern, a gate electrode and a plurality of insulation layers. The display substrate also includes a plurality of wirings over the stack structure and a plurality of colored capping patterns over respective ones of the wirings.

22 Claims, 17 Drawing Sheets

DISPLAY SUBSTRATES, METHODS OF MANUFACTURING THE SAME AND DISPLAY DEVICES INCLUDING THE SAME

CROSS-REFERENCE TO RELATED APPLICATION

This application claims priority under 35 USC § 119 to Korean Patent Application No. 10-2016-0017686, filed on Feb. 16, 2016, in the Korean Intellectual Property Office (KIPO), the content of which is incorporated by reference herein in its entirety.

BACKGROUND

Field

The described technology generally relates to display substrates, methods of manufacturing the same and display devices including the same.

Description of the Related Technology

In a display device such as an organic light-emitting diode (OLED) device and a liquid crystal display (LCD), a display substrate generally includes a thin film transistor (TFT), a capacitor and wirings. A display structure including electrodes and an emitting layer is then formed on the display substrate.

As a display resolution increases, the size of a pixel or pixel circuit becomes smaller. Accordingly, methods of forming fine patterns are being developed for achieving a high resolution display device.

SUMMARY OF CERTAIN INVENTIVE ASPECTS

One inventive aspect relates to a display substrate having an improved display quality.

Another aspect is a method of forming a display substrate having an improved display quality.

Another aspect is a display device having an improved display quality.

Another aspect is a display substrate that includes a base substrate, a lower stack structure on the base substrate, the lower stack structure including an active pattern, a gate electrode and a plurality of insulation layers, wirings on the lower stack structure, and colored capping patterns on respective ones of the wirings.

In example embodiments, the lower stack structure includes a plurality of stepped portions, and the wirings include upper surfaces having different heights.

In example embodiments, upper surfaces of the capping patterns are at the same height.

In example embodiments, the capping patterns include a non-photosensitive polymer containing a colored material.

In example embodiments, the colored material include a black material or a dye.

In example embodiments, the dye has an absorbance to a light having a wavelength in a range from about 300 nm to about 500 nm.

In example embodiments, the insulation layers include a barrier layer on a top surface of the base substrate, a gate insulation layer on the barrier layer, the gate insulation layer covering the active pattern, and an insulating interlayer on the gate insulation layer, the insulating interlayer covering the gate electrode.

In example embodiments, the gate electrode includes a first gate electrode and a second gate electrode overlapping each other. The gate insulation layer can include a first gate insulation layer between the active pattern and the first gate electrode, and a second gate insulation layer between the first gate electrode and the second gate electrode.

In example embodiments, portions of the wirings overlapping the active pattern, the first gate electrode and the second gate electrode in a height direction of the lower stack structure have an uppermost surface among upper surfaces of the wirings.

In example embodiments, portions of the wirings overlapping areas of the lower stack structure from which the active pattern, the first gate electrode and the second gate electrode are omitted have a lowermost surface among upper surfaces of the wirings.

In example embodiments, the display device further includes a first electrode and a second electrode extending through the insulating interlayer and the gate insulation layer to contact the active pattern.

In example embodiments, the display device further includes a first electrode capping pattern and a second electrode capping pattern disposed on the first electrode and the second electrode, respectively.

In example embodiments, the first electrode capping pattern and the second electrode capping pattern include the same material as that of the capping patterns. Upper surfaces of the first electrode capping pattern and the second electrode capping pattern can be at the same height as those of the capping patterns.

In example embodiments, the display device further includes a via insulation layer on the insulating interlayer, the via insulation layer covering the first electrode and the second electrode, a third electrode on the via insulation layer, the third electrode electrically connected to the second electrode, and a pixel defining layer on the via insulation layer, the pixel defining layer partially covering the third electrode.

Another aspect is a display device that includes a base substrate, a lower stack structure on the base substrate, the lower stack structure including an active pattern, a gate electrode and a plurality of insulation layers, wirings on the lower stack structure, the wirings including upper surfaces that have different heights, capping patterns on respective ones of the wirings, the capping patterns including upper surfaces at the same height, a source electrode and a drain electrode extending through at least a portion of the insulation layers to be electrically connected to the active pattern, a pixel electrode electrically connected to the drain electrode, a display layer on the pixel electrode, and an opposing electrode facing the pixel electrode with respect to the display layer.

In example embodiments, the capping patterns include a colored non-photosensitive polymer.

In example embodiments, the capping patterns include a dye or a black material.

In example embodiments, the display device further includes gate lines crossing the wirings. The gate electrode can include a first gate electrode and a second gate electrode overlapping each other.

In example embodiments, the wirings include stepped portions depending on a profile of the lower stack structure, and the stepped portions are planarized by the capping patterns.

Another aspect is a method of manufacturing a display substrate. In the method, an active pattern can be formed on a base substrate. A gate insulation layer can be formed on the base substrate to cover the active pattern. A gate electrode can be formed on the gate insulation layer. An insulating interlayer can be formed on the gate insulation layer to cover the gate electrode. A conductive layer can be formed on the insulating interlayer. The conductive layer can include a stepped portion at an area overlapping at least one of the active pattern or the gate electrode. A planarization layer can be formed on the conductive layer. A photoresist layer can be formed on the planarization layer. A photoresist pattern can be formed by partially removing the photoresist layer. The planarization layer and the conductive layer can be partially removed by a photo-lithography process using the photoresist pattern to form capping patterns and wirings.

In example embodiments, the planarization layer is formed of a colored non-photosensitive polymer.

In example embodiments, the photoresist pattern is formed by performing an exposure process. The planarization layer can include a dye having an absorbance to a light used in the exposure process.

In example embodiments, electrodes are formed through the insulating interlayer and the gate insulation layer to contact the active pattern. Electrode capping patterns can be formed on the electrodes. The electrodes and the electrode capping patterns can be formed from the conductive layer and the planarization layer, respectively, by the photo-lithography process.

Another aspect is a display substrate, comprising: a base substrate; a stack structure over the base substrate, the stack structure including an active pattern, a gate electrode and a plurality of insulation layers; a plurality of wirings over the stack structure; and a plurality of colored capping patterns over respective ones of the wirings.

In the above display substrate, the stack structure includes a plurality of stepped portions, wherein the wirings include a plurality of upper surfaces having different heights from the substrate.

In the above display substrate, the colored capping patterns respectively have a plurality of upper surfaces having the same distance from the base substrate.

In the above display substrate, the colored capping patterns are formed of a non-photosensitive polymer including a colored material.

In the above display substrate, the colored material includes a black material or a dye.

In the above display substrate, the dye is configured to absorb light having a wavelength in the range from about 300 nm to about 500 nm.

In the above display substrate, the insulation layers include: a barrier layer over a top surface of the base substrate; a gate insulation layer over the barrier layer, the gate insulation layer covering the active pattern; and an insulating interlayer over the gate insulation layer, the insulating interlayer covering the gate electrode.

In the above display substrate, the gate electrode includes a first gate electrode and a second gate electrode overlapping each other in the depth dimension of the display substrate, and wherein the gate insulation layer includes: a first gate insulation layer interposed between the active pattern and the first gate electrode; and a second gate insulation layer interposed between the first gate electrode and the second gate electrode.

In the above display substrate, a plurality of portions of the wirings overlapping the active pattern, the first gate electrode and the second gate electrode in the depth direction of the stack structure have an uppermost surface among a plurality of upper surfaces of the wirings.

In the above display substrate, a plurality of portions of the wirings, overlapping the stack structure from which the active pattern, the first gate electrode and the second gate electrode are omitted, have the lowermost ones among a plurality of upper surfaces of the wirings.

The above display substrate further comprises a first electrode and a second electrode extending through the insulating interlayer and the gate insulation layer to contact the active pattern.

The above display substrate further comprises a first electrode capping pattern and a second electrode capping pattern respectively disposed over the first electrode and the second electrode.

In the above display substrate, the first and second electrode capping patterns are formed of the same material as that of the colored capping patterns, wherein a plurality of upper surfaces of the first and second electrode capping patterns have the same height as those of the colored capping patterns.

The above display substrate further comprises: a via insulation layer over the insulating interlayer, the via insulation layer covering the first electrode and the second electrode; a third electrode over the via insulation layer, the third electrode electrically connected to the second electrode; and a pixel defining layer over the via insulation layer, the pixel defining layer partially covering the third electrode.

Another aspect is a display device, comprising: a base substrate; a stack structure over the base substrate, the stack structure including an active pattern, a gate electrode and a plurality of insulation layers; a plurality of wirings over the stack structure, the wirings including a plurality of upper surfaces that have different heights; a plurality of capping patterns over respective ones of the wirings, the capping patterns respectively including a plurality of upper surfaces having the same distance from the base substrate; a source electrode and a drain electrode extending through at least a portion of the insulation layers to be electrically connected to the active pattern; a pixel electrode electrically connected to the drain electrode; a display layer over the pixel electrode; and an opposing electrode facing the pixel electrode with respect to the display layer.

In the above display device, the capping patterns are formed of a colored non-photosensitive polymer.

In the above display device, the capping patterns include a dye or a black material.

The above display device further comprises a plurality of gate lines respectively crossing the wirings, wherein the gate electrode includes a first gate electrode and a second gate electrode overlapping each other in the depth dimension of the display device.

In the above display device, each of the wirings includes a stepped portion based on a profile of the stack structure, wherein each stepped portion is planarized by the capping patterns.

In the above display device, the capping patterns respectively have a plurality of upper surfaces equidistant from the base substrate.

In the above display device, the capping patterns respectively have a plurality of lower surfaces that are not equidistant from the base substrate.

In the above display device, at least two of the capping patterns have different thicknesses.

Another aspect is a method of manufacturing a display substrate, comprising: forming an active pattern over a base substrate; forming a gate insulation layer over the base substrate to cover the active pattern; forming a gate electrode over the gate insulation layer; forming an insulating interlayer over the gate insulation layer to cover the gate electrode; forming a conductive layer over the insulating interlayer, the conductive layer including a stepped portion at an area overlapping at least one of the active pattern or the gate electrode in the depth dimension of the display substrate; forming a planarization layer over the conductive layer; forming a photoresist layer over the planarization layer; partially removing the photoresist layer so as to form a photoresist pattern; and partially removing the planarization layer and the conductive layer with a photo-lithography process based on the photoresist pattern so as to form a plurality of capping patterns and a plurality of wirings.

In the above method, the planarization layer is formed of a colored non-photosensitive polymer.

In the above method, forming the photoresist pattern includes performing an exposure process, wherein the planarization layer includes a dye having an absorbance to a light used in the exposure process.

The above method further comprises: forming a plurality of electrodes through the insulating interlayer and the gate insulation layer to contact the active pattern; and forming a plurality of electrode capping patterns over the electrodes, wherein the electrodes and the electrode capping patterns are respectively formed from the conductive layer and the planarization layer with the photo-lithography process.

DETAILED DESCRIPTION OF CERTAIN INVENTIVE EMBODIMENTS

Figure 1:
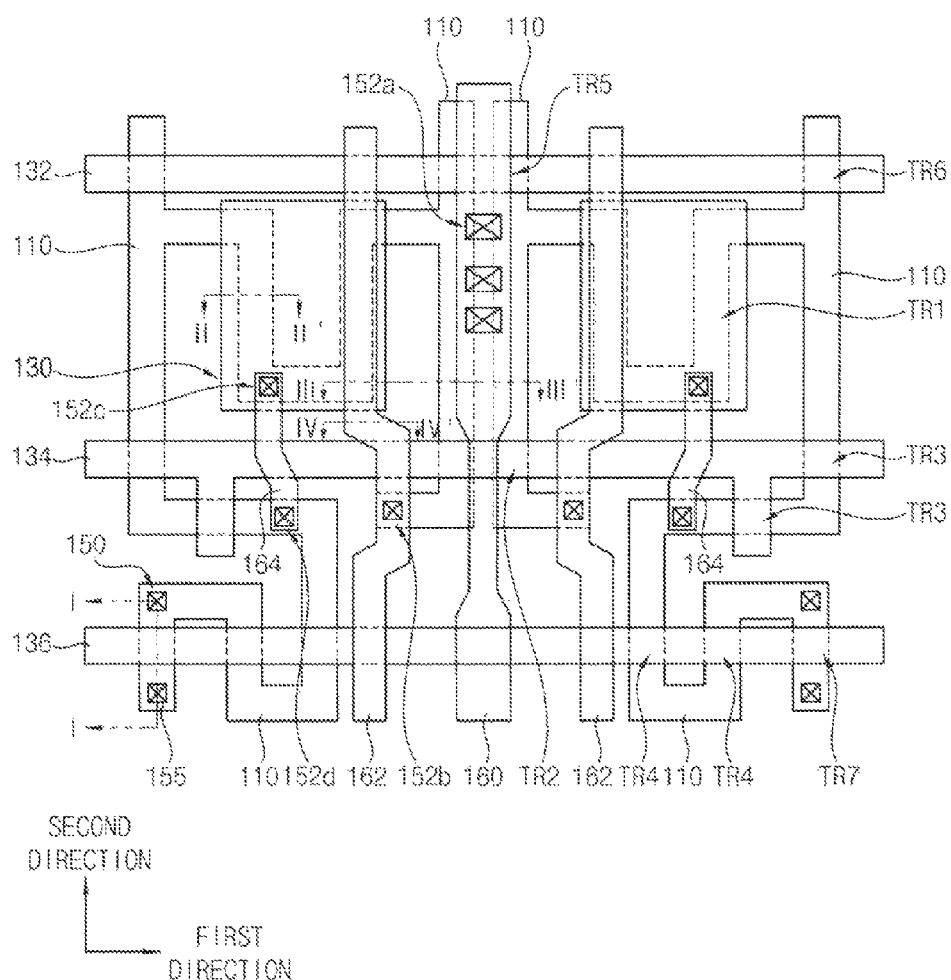
FIG. 1 is a top plan view illustrating a display substrate in accordance with example embodiments.

Various example embodiments will be described more fully hereinafter with reference to the accompanying drawings, in which some example embodiments are shown. The described technology can, however, be embodied in many different forms and should not be construed as limited to the example embodiments set forth herein. Rather, these example embodiments are provided so that this description will be thorough and complete, and will fully convey the scope of the described technology to those skilled in the art. In the drawings, the sizes and relative sizes of layers and regions can be exaggerated for clarity.

Like numerals refer to like elements throughout. As used herein, the term "and/or" includes any and all combinations of one or more of the associated listed items.

It will be understood that, although the terms first, second, third, fourth etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the described technology. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the described technology.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions can include a third direction that can be orthogonal to the two different directions. The plurality of device structures can be integrated in a same electronic device. For example, when a device structure (e.g., a memory cell structure or a transistor structure) is illustrated in a cross-sectional view, an electronic device can include a plurality of the device structures (e.g., memory cell structures or transistor structures), as would be illustrated by a plan view of the electronic device. The plurality of device structures can be arranged in an array and/or in a two-dimensional pattern. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
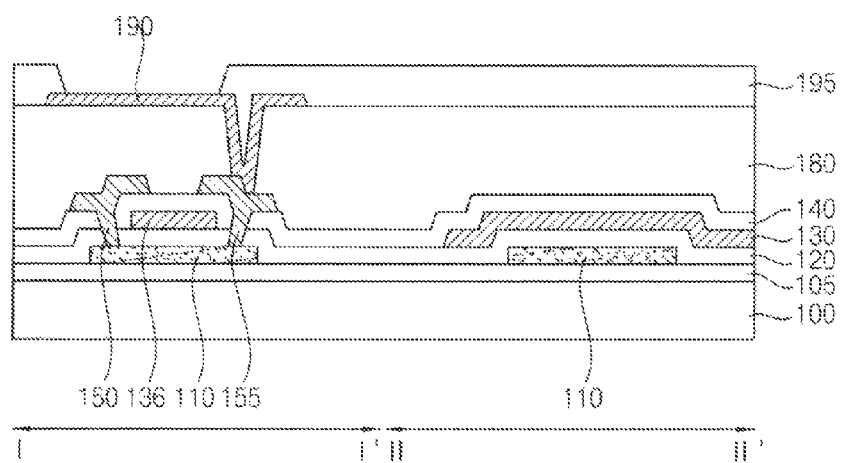
FIGS. 2 and 3 are cross-sectional views illustrating a display substrate in accordance with example embodiments.
Figure 3:
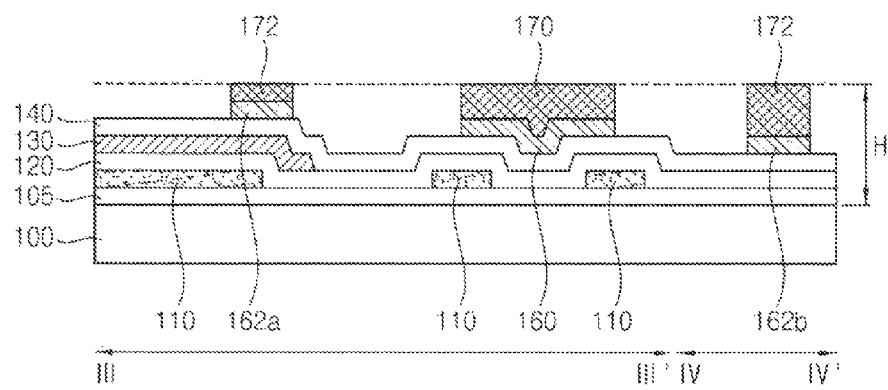

FIG. 1 is a top plan view illustrating a display substrate in accordance with example embodiments. FIGS. 2 and 3 are cross-sectional views illustrating a display substrate in accordance with example embodiments.

For example, FIG. 1 includes a circuit layout of pixels included in the display substrate. For example, FIG. 1 illustrates two pixels neighboring each other. For convenience of descriptions, an illustration of insulative structures is omitted in FIG. 1. Two directions parallel to a top surface of a base substrate 100 and perpendicular to each other are defined as a first direction and a second direction. The definitions of the directions can be the same throughout all figures provided herein.

FIG. 2 includes cross-sectional views taken along lines I-I' and II-II' indicated in FIG. 1. FIG. 3 includes cross-sectional views taken along lines III-III' and IV-IV' indicated in FIG. 1.

Referring to FIGS. 1 to 3, the display substrate includes an active pattern 110, gate lines 132, 134 and 136, a gate electrode 130 and wirings 160, 162 and 164 which can be disposed on the base substrate 100. Capping patterns 170 and 172 can be formed on the wirings 160, 162 and 164.

The display substrate can further include an insulation structure including a plurality of insulation layers, and electrodes. The insulation structure can include a barrier layer 105, a gate insulation layer 120, an insulating interlayer 140, a via insulation layer 180 and a pixel defining layer 195. The electrodes can include first to third electrodes 150, 155 and 190.

A glass substrate or a plastic substrate can be used as the base substrate 100. In some embodiments, the base substrate 100 includes a polymeric material having transparent and flexible properties. In this case, the display substrate can be implemented in a transparent flexible display device. For example, the base substrate 100 is formed of polyimide, an epoxy-based resin, an acryl-based resin, polyester, or the like. In an embodiment, the base substrate 100 is formed of polyimide.

The barrier layer 105 can be formed on the top surface of the base substrate 100. The barrier layer 105 can prevent impurities and moistures from being diffused between the base substrate 100 and structures thereon.

For example, the barrier layer 105 is formed of silicon oxide, silicon nitride or silicon oxynitride. These can be used alone or in a combination thereof. The barrier layer 105 can have a multi-layered structure including a silicon oxide layer and a silicon nitride layer.

The active pattern 110 can be disposed on the barrier layer 105. The active pattern 100 can be arranged in a repeated shape per each pixel. The active pattern 110 can include a silicon compound such as polysilicon. P-type or N-type impurities can be doped at some portions of the active pattern 110 to increase a conductivity thereof.

In some embodiments, the active pattern 110 is formed of an oxide semiconductor, e.g., indium gallium zinc oxide (IGZO), zinc tin oxide (ZTO) or indium tin zinc oxide (ITZO).

The gate insulation layer 120 can be formed on the barrier layer 105, and can cover the active pattern 110. The gate insulation layer 120 can include silicon oxide, silicon nitride or silicon oxynitride. These can be used alone or in a combination thereof. The gate insulation layer 120 can have a multi-layered structure including a silicon oxide layer and a silicon nitride layer.

As illustrated in FIGS. 2 and 3, the gate insulation layer 120 can have a conformal surface profile along surfaces of the barrier layer 105 and the active pattern 110. In some embodiments, the gate insulation layer 120 includes a step portion at an area overlapping the active pattern 110.

The gate electrode 130 and first to third gate lines 132, 134 and 136 can be disposed on the gate insulation layer 120.

In example embodiments, the gate lines 132, 134 and 136 extend in the first direction, and overlap a plurality of regions of the active pattern 110. Further, the gate lines 132, 134 and 136 can overlap the active patterns 110 included in a plurality of pixels.

The gate electrode 130 can have a plate shape overlapping a region of the active pattern 110.

In some embodiments, the first gate line 132 serves as an emitting control line. The second and third 134 and 136 can serve as scan lines. The gate electrode 130 can be interposed between the first gate line 132 and the second gate line 134 in a plan view.

The P-type or N-type impurities can be doped in regions of the active pattern 110 which does not overlap the gate electrode 130 and the gate lines 132, 134 and 136 to provide the conductivity. Regions of the active pattern 110 substantially overlapping the gate electrode 130 and the gate lines 132, 134 and 136 can serve as channel regions.

Thus, a plurality of transistors can be defined by the gate electrode 130, the gate lines 132, 134 and 136, and the active pattern 110. In some embodiments, as illustrated in FIG. 1, a first transistor TR1 is defined at an overlapping region of the gate electrode 130 and the active pattern 110. Second to seventh transistors TR2, TR3, TR4, TR5, TR6 and TR7 can be defined at overlapping regions of the gate lines 132, 134 and 136, and the active pattern 110.

In some embodiments, the first transistor TR1 serves as a driving transistor supplying a driving current to the display substrate or a display device including the display substrate. For example, the seventh transistor TR7 serves as a switching transistor.

The gate electrode 130 and the gate lines 132, 134 and 136 include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc), an alloy thereof or a nitride thereof. These can be used alone or in a combination thereof. The gate electrode 130 and the gate lines 132, 134 and 136 can include at least two metal layers having different physical and chemical properties. For example, the gate electrode 130 and the gate lines 132, 134 and 136 have a multi-layered structure such as an Al/Mo structure or a Ti/Cu structure.

The insulating interlayer 140 can be formed on the gate insulation layer 120, and can cover the gate electrode 130 and the gate lines 132, 134 and 136. The insulating interlayer 140 can be formed of silicon oxide, silicon nitride or silicon oxynitride. These can be used alone or in a combination thereof. The insulating interlayer 140 can have a multi-layered structure including a silicon oxide layer and a silicon nitride layer.

As illustrated in FIGS. 2 and 3, the insulating interlayer 140 can have a conformal surface profile along surfaces of the gate insulation layer 120, the gate electrode 130, and the gate lines 132, 134 and 136. In some embodiments, the insulating interlayer 140 can have stepped portions at areas overlapping the active pattern 110, the gate electrode 130 and/or the gate lines 132, 134 and 136.

As illustrated in FIG. 2, the first electrode 150 and the second electrode 155 extend through the insulating interlayer 140 and the gate insulation layer 120 to contact the active pattern 110. For example, the first electrode 150 and the second electrode 155 are in contact with impurity regions of the active pattern 110. For example, a portion of the active pattern 110 which overlaps the second gate line 136 between the impurity regions can serve as a channel region through which charges can be transferred or moved.

In some embodiments, the first electrode 150 and the second electrode 155 serve as a source electrode and a drain electrode, respectively.

As illustrated in FIGS. 1 and 3, first to third wirings 160, 162 and 164 are disposed on the insulating interlayer 140.

The first wiring 160 and the second wiring 162 can extend in the second direction, and can cross the gate lines 132, 134 and 136. The first wiring 160 and the second wiring 162 can be provided commonly in the pixels, and can be repeatedly arranged along the first direction.

The first wiring 160 can be disposed substantially at a boundary of pixels neighboring in the first direction. As illustrated in FIGS. 1 and 3, the first wiring 160 is commonly and partially overlap the active patterns 100 included in the neighboring two pixels. In some embodiments, the first wiring 160 serves as a power line (e.g., an ELVDD line) of the display substrate or the display device.

The second wiring 162 can be adjacent to the first wiring 160 along the first direction, and can extend in the second direction to overlap the gate lines 132, 134 and 136, and the gate electrode 130. In some embodiments, the second wiring 162 serves as a data line of the display substrate or the display device.

The second wiring 162 can overlap the gate electrode 130 or the gate lines 132, 134 and 136 with respect to the insulating interlayer 140, and thus at least one capacitor can be formed in each pixel.

The third wiring 164 can cross the second gate line 134, and can be electrically connected to the gate electrode 130 and the active pattern 110. For example, the third wiring 164 serves as a source line of the display substrate or the display device.

In example embodiments, the first to third wirings 160, 162 and 164 include stepped portions according to profiles of lower structures. For example, the first to third wirings 160, 162 and 164 include upper surfaces having different heights. Further, each of the first to third wirings 160, 162 and 164 can include a plurality of upper surfaces having different heights.

As illustrated in FIG. 3, a portion of the second wiring 162 (designated as a first portion 162a) is disposed on a stack structure including the gate electrode 130 and the active pattern 110. Thus, the first portion 162a can have a relatively high upper surface. A portion of the first wiring 160 can be disposed on a stack structure from which the gate electrode 130 is omitted, and can have an upper surface lower than that of the first portion 162a of the second wiring 162. A second portion 162b of the second wiring 162 can be disposed on a stack structure from which the gate electrode 130 and the active pattern 110 are omitted. Thus, the second portion 162b can include the lowest upper surface among the wiring.

A stack structure between the active patterns 110 adjacent to each other can include a recess, and thus the first wiring 160 on the stack structure can also include a recess or a stepped portion.

The first to third wiring 160, 162 and 164 can be formed of a metal such as Ag, Mg, Al, W, Cu, Ni, Cr, Mo, Ti, Pt, Ta, Nd, Sc, etc., an alloy of the metals and/or a nitride of the metal. The first to third wirings 160, 162 and 164 can have a multi-layered structure including at least two different metal layers.

In some embodiments, the insulating interlayer 140 includes a plurality of layers. For example, the first electrode 150 and the second electrode 155 are disposed on a first insulating interlayer, and a second insulating interlayer covering the first and second electrodes 150 and 155 can be formed on the first insulating interlayer. The first to third insulating interlayers 160, 162 and 164 can be disposed on the second insulating interlayer.

The first to third wirings 160, 162 and 164 can be electrically connected to the active pattern 110 via contacts.

As illustrated in FIG. 1, the first wiring 160 is electrically connected to the active pattern 110 via a first contact 152a. In some embodiments, the first contact 152a is connected commonly to the active patterns 110 included in the two neighboring pixels. A driving current can be supplied from the first wiring 160 to the active pattern 110 through the first contact 152a.

The second wiring 162 can be electrically connected to the active pattern 110 via a second contact 152b. The third wiring 164 can be electrically connected to the gate electrode 130 and the active pattern 110 via a third contact 152c and a fourth contact 152d, respectively.

In example embodiments, as illustrated in FIG. 3, the capping patterns 170 and 172 are disposed on the upper surfaces of the wirings 160, 162 and 164. Accordingly, the upper surfaces of the wirings 160, 162 and 164 can be covered by the capping patterns 170 and 172, and may not be externally exposed.

The first capping pattern 170 can be disposed on the first wiring 160, and the second capping pattern 172 can be disposed on the second wiring 162. A third capping pattern (not illustrated) can be disposed on the third wiring 164.

In example embodiments, the capping patterns include upper surfaces having the same height. The capping pattern can have a relatively small thickness on the wiring having a relatively high upper surface. The capping pattern can have a relatively large thickness on the wiring having a relatively low upper surface.

Thus, upper surfaces of the first capping pattern 170, the second capping pattern 172 and the third capping pattern can be substantially coplanar with each other. For example, as illustrated in FIG. 3, the upper surfaces of the first capping pattern 170, the second capping pattern 172 and the third capping pattern are at the same height (designated as "H") from the top surface of the base substrate 100.

In example embodiments, the capping patterns are formed of a colored polymeric material. In some embodiments, the capping patterns are formed of a non-photosensitive polymeric material in which a colored material can be dispersed or combined. For example, the non-photosensitive polymeric material includes a back-bone structure of novolac, polystyrene, polyhydroxystyrene (PHS), polyacrylate, polymethacrylate, polyvinyl ester, polyvinyl ether, polyolefin, polynorbornene, polyester, polyamide, polycarbonate, etc. A functional group having a reactivity in an exposure process (e.g., a protecting group or a leaving group) may not be included in the back-bone structure.

The colored material included in the capping pattern can include a black material such as carbon black, or a light-absorbant dye material. In some embodiments, the dye material has an absorbance to a light having a wavelength in a range from about 300 nm to about 500 nm.

The capping patterns can cover the wirings 160, 162 and 164 so that a light reflected from the wirings 160, 162 and 164 can be absorbed or blocked. Thus, degradation of display quality caused by an external light can be prevented.

As illustrated in FIG. 2, the via insulation layer 180 is formed on the insulating interlayer 140, and covers the first electrode 150, the second electrode 155 and the capping patterns. For convenience of descriptions, an illustration of the via insulation layer 180 is omitted in FIG. 3.

A via structure for connecting the second electrode 155 and the third electrode 190 can be formed in the via insulation layer 180. In some embodiments, the via insulation layer 180 serves as a planarization layer of the display substrate. The via insulation layer 180 can include an organic material such as polyimide, an epoxy-based resin, an acryl-based resin, polyester, or the like.

The third electrode 190 can be disposed on the via insulation layer 180, and can include the via structure extending through the via insulation layer 180 to be electrically connected to the second electrode 155. In example embodiments, the third electrode 190 is individually formed on each pixel. The third electrode 190 can serve as an anode or a pixel electrode of the display substrate or the display device.

In an embodiment, the third electrode 190 includes a transparent conductive material having a high work function. For example, the third electrode 190 is formed of indium tin oxide (ITO), indium zinc oxide (IZO), zinc oxide or indium oxide.

In an embodiment, the third electrode 190 serves as a reflective electrode. In this case, the third electrode 190 can include a metal such as Al, Ag, W, Cu, Ni, Cr, Mo, Ti, Pt, Ta, Nd or Sc, or an alloy thereof.

In an embodiment, the third electrode 190 has a multi-layered structure including the transparent conductive material and the metal.

A back-plane (BP) structure of the display device can be defined by the insulation structure, the active pattern 110, the gate electrode 130, the gate lines 132, 134 and 136, the wirings 160, 162 and 164, and the electrodes 150, 155 and 190 which are disposed on the base substrate 100.

The BP structure can further include a pixel defining layer 195. The pixel defining layer 195 can be formed on the via insulation layer 180, and can cover a peripheral portion of the third electrode 190. The pixel defining layer 195 can include an organic material, e.g., polyimide or an acryl-based resin.

Figure 4:
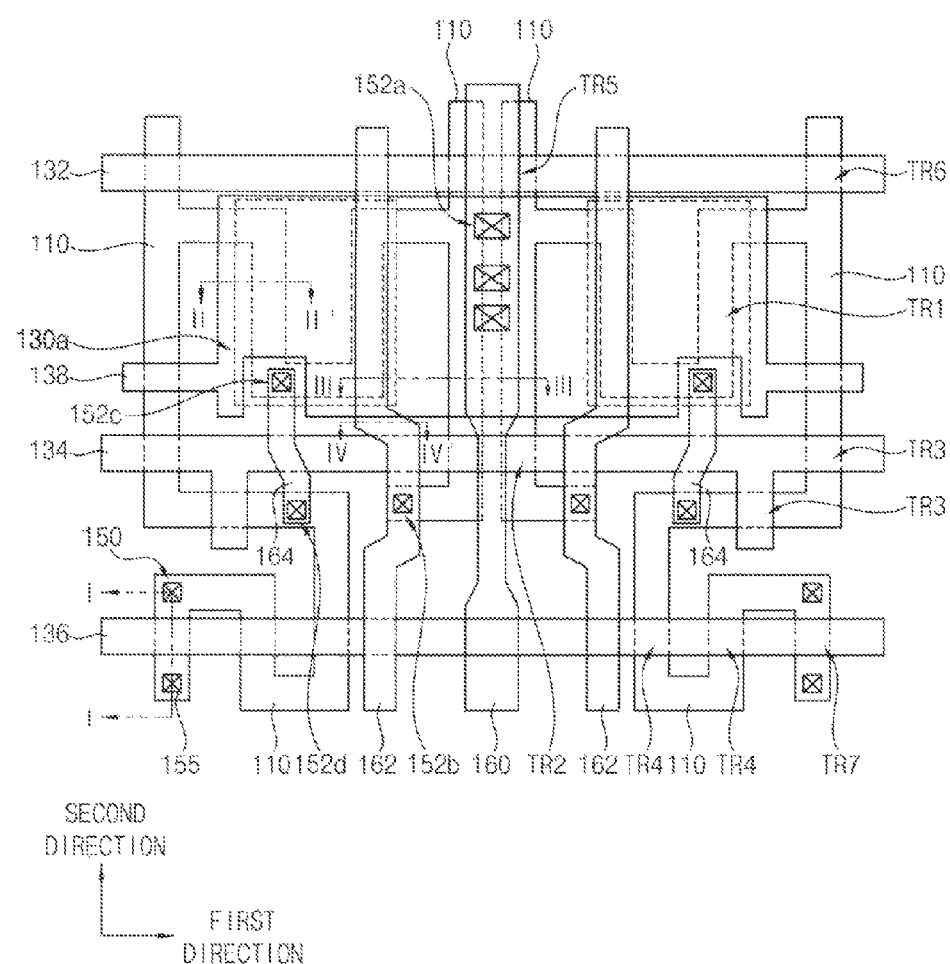
FIG. 4 is a top plan view illustrating a display substrate in accordance with example embodiments.
Figure 5:
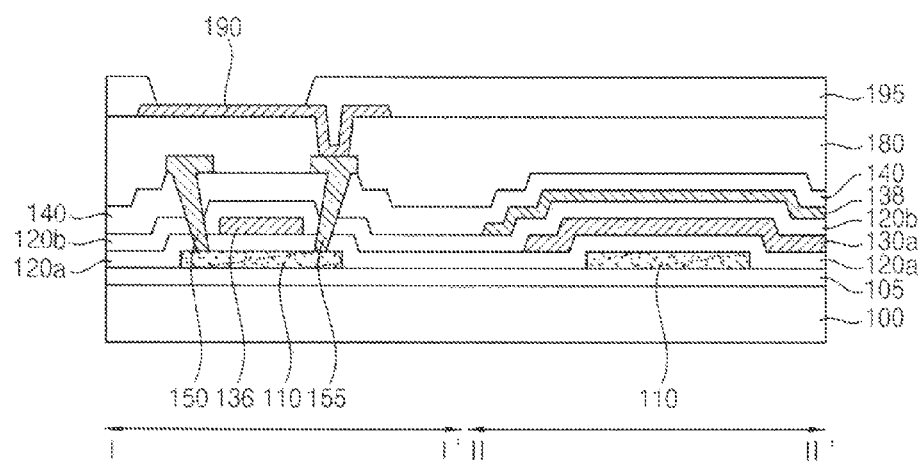
FIGS. 5 and 6 are cross-sectional views illustrating a display substrate in accordance with example embodiments.
Figure 6:
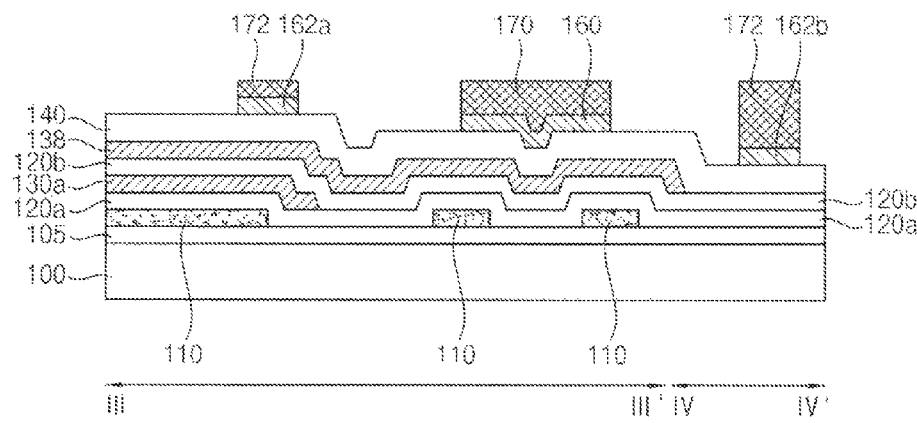

FIG. 4 is a top plan view illustrating a display substrate in accordance with example embodiments. FIGS. 5 and 6 are cross-sectional views illustrating a display substrate in accordance with example embodiments. FIG. 5 includes cross-sectional views taken along lines I-I' and II-II' indicated in FIG. 4. FIG. 6 includes cross-sectional views taken along lines III-III' and IV-IV' indicated in FIG. 4.

The display substrate of FIGS. 4 to 6 has elements and/or constructions substantially the same as or similar to those illustrated in FIGS. 1 to 3 except for constructions of a gate electrode and a gate insulation layer. Thus, detailed descriptions on repeated elements and/or structures are omitted herein, and like reference numerals are used to designate like elements.

Referring to FIGS. 4 to 6, the gate electrode and the gate insulation layer included in the display substrate each has a multi-layered structure. In example embodiments, a first gate electrode 130a substantially the same as the gate electrode 130 of FIGS. 1 to 3 is disposed on a first gate insulation layer 120a. The first gate insulation layer 120a can include a material and a profile substantially the same as or similar to those of the gate insulation layer 120 illustrated in FIGS. 1 to 3.

A second gate insulation layer 120b can be formed on the first gate insulation layer 120a, and can cover the first gate electrode 130a, and the gate lines 132, 134 and 136. The second gate insulation layer 120b can include stepped portions at areas overlapping the active pattern 110, the first gate electrode 130a, and the gate lines 132, 134 and 136.

A second gate electrode 138 can be disposed on the second gate insulation layer 120b. As illustrated in FIG. 4, the second gate electrode 138 can overlap the first gate electrode 130a between the first and second gate lines 132 and 134. In some embodiments, the second gate electrode 138 extends in the first direction to be commonly provided for a plurality of pixels.

The second gate electrode 138 can overlap the first gate electrode 130a with respect to the second gate insulation layer 120b. In example embodiments, a storage capacitor (Cst) of the display substrate or the display device is defined by the second gate electrode 138, the second gate insulation layer 120b and the first gate electrode 130a.

An insulating interlayer 140 can be formed on the second gate insulation layer 120b, and can cover the second gate electrode 138. The insulating interlayer 140 can include stepped portions having different heights at areas overlapping the active pattern 110, the first gate electrode 130a and/or the second gate electrode 138.

As also illustrated with reference to FIGS. 1 to 3, first to third wirings 160, 162 and 164 including upper surfaces at different heights can be formed on the insulating interlayer 140.

As illustrated in FIG. 6, a first portion 162a of the second wiring 162 is disposed on a stack structure including the second gate electrode 138, the first gate electrode 130a and the active pattern 110. Thus, the first portion 162a can have a relatively high upper surface. A portion of the first wiring 160 can be disposed on a stack structure from which the first gate electrode 130a is omitted, and can have an upper surface lower than that of the first portion 162a of the second wiring 162. A second portion 162b of the second wiring 162 can be disposed on a stack structure from which the gate electrodes 130a and 138, and the active pattern 110 are omitted. Thus, the second portion 162b can include the lowest upper surface among the wirings. Further, a stack structure between the active patterns 110 adjacent to each other can include a recess, and thus the first wiring 160 on the stack structure can also include a recess or a step portion.

As also illustrated with reference to FIGS. 1 to 3, capping patterns are disposed on the wirings 160, 162 and 164. A first capping pattern 170 can be disposed on the first wiring 160, and a second capping pattern 172 can be disposed on the second wiring 162. A third capping pattern (not illustrated) can be disposed on the third wiring 164.

As described above, the capping patterns can have different thicknesses, and can include upper surfaces at the same height.

A first electrode 150 and a second electrode 155 can extend through the insulating interlayer 140, the second gate insulation layer 120b and the first gate insulation layer 120a to contact the active pattern 110. A via insulation layer 180 can be formed on the insulating interlayer 140, and can cover the first electrode 150 and the second electrode 155.

A third electrode 190 can be disposed on the via insulation layer 180, and can be electrically connected to the second electrode 155. A pixel defining layer 195 can be formed on the via insulation layer 180 to partially cover the third electrode 190.

Figure 7:
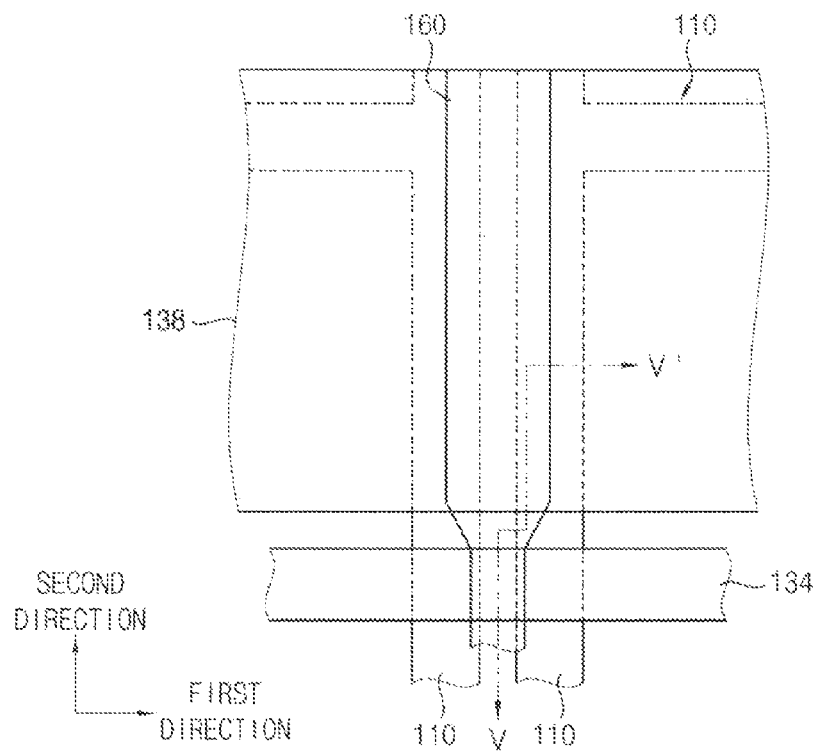
FIGS. 7 and 8 are a top plan view and a cross-sectional view, respectively, illustrating a region adjacent to a wiring included in a display substrate in accordance with example embodiments.
Figure 8:
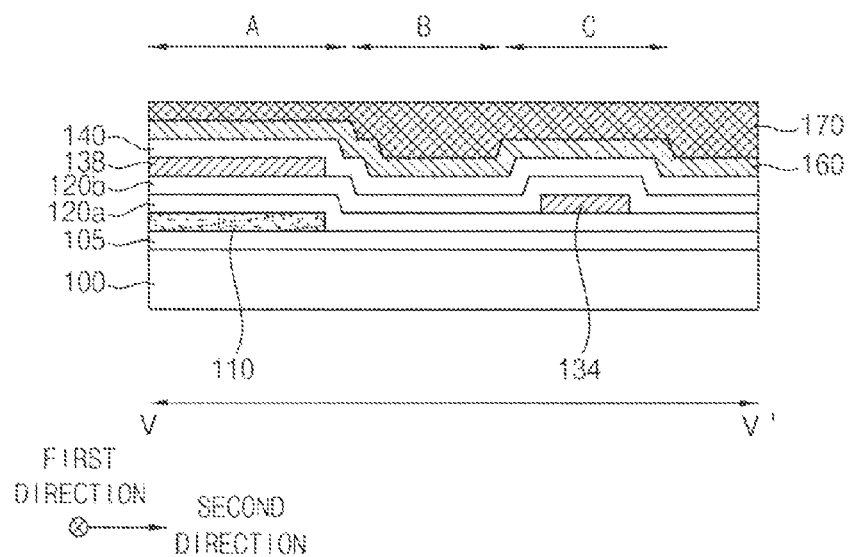

FIGS. 7 and 8 are a top plan view and a cross-sectional view, respectively, illustrating a region adjacent to a wiring included in a display substrate in accordance with example embodiments. For example, FIGS. 7 and 8 illustrate a portion of the first wiring 160 and a stack structure around the portion of the first wiring 160 included in the display substrate of FIGS. 4 to 6.

Referring to FIGS. 7 and 8, the first wiring 160 extends in the second direction, and includes a plurality of upper surfaces having different heights. As illustrated in FIG. 8, the first wiring 160 has a relatively high upper surface at an area overlapping the second gate electrode 138 and the active pattern 110 (e.g., an area designated as "A"). The first wiring 160 can have a relatively low upper surface at an area from which the second gate electrode 138 and the active pattern 110 are omitted, and the second gate line 134 is added (e.g., an area designated as "C"). The first wiring 160 can have the lowest upper surface at an area from which the second gate electrode 138, the active pattern 110 and the second gate line 134 are omitted (e.g., an area designated as "B").

The first capping pattern 170 can cover the first wiring 160, and can extend in the second direction together with the first wiring 160. As illustrated in FIG. 8, a thickness of the first capping pattern 170 can be changed depending on a stepped structure of the first wiring 160.

For example, the first capping pattern 170 has a relatively small thickness at the area "A," and has a relatively large thickness at the area "C." The first capping pattern 170 can have the largest thickness at the area "B."

In example embodiments, the first capping pattern 170 has a variable thickness and includes a substantially planar top surface. Thus, the stepped portions of the first wiring 160 caused by the stack structure under the first wiring 160 can be planarized by the first capping pattern 170.

Figure 9:
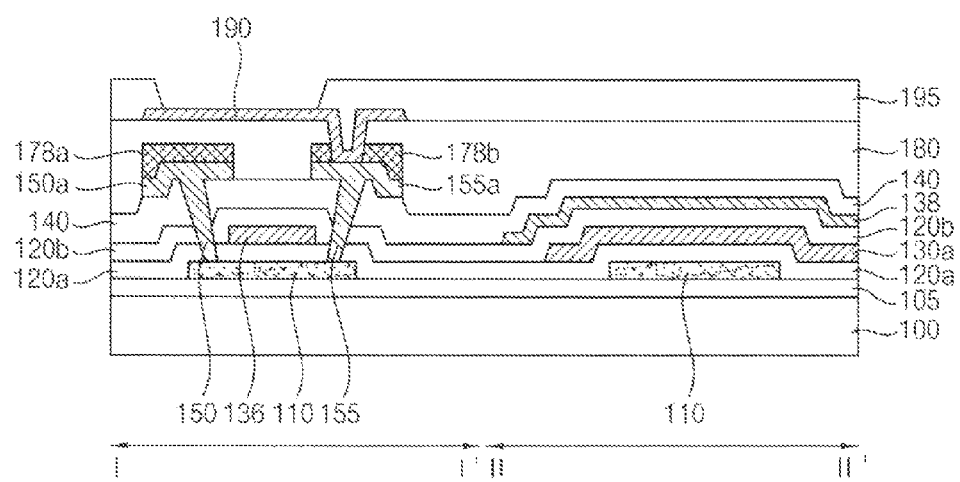
FIG. 9 is a cross-sectional view illustrating a display substrate in accordance with example embodiments.

FIG. 9 is a cross-sectional view illustrating a display substrate in accordance with example embodiments. The display substrate of FIG. 9 can have elements and/or constructions substantially the same as or similar to those illustrated with reference to FIGS. 1 to 3, or FIGS. 4 to 6 except for an electrode capping pattern. Thus, detailed descriptions on repeated elements and/or structures are omitted herein, and like reference numerals are used to designate like elements.

Referring to FIG. 9, a first electrode 150a and a second electrode 155a extend through the insulating interlayer 140, a second gate insulation layer 120b and a first gate insulation layer 120a to be in contact with an active pattern 110. In some embodiments, the first electrode 150a and the second electrode 155a each includes a stepped portion or upper surfaces having different heights depending on a profile of a lower stack structure (or stack structure).

In example embodiments, a first electrode capping pattern 178a and a second electrode capping pattern 178b are disposed on the first electrode 150a and the second electrode 155a, respectively. The first electrode capping pattern 178a and the second electrode capping pattern 178b can each has a substantially planar upper surface. The upper surfaces of the first and second electrode capping patterns 178a and 178b can be positioned at substantially the same height, or can be coplanar with each other.

The stepped portions included in the first electrode 150a and the second electrode 155a can be planarized or removed by the first electrode capping pattern 178a and the second electrode capping pattern 178b.

In some embodiments, the first electrode capping pattern 178a and the second electrode capping pattern 178b are formed of a material substantially the same as or similar to that included in the capping patterns 170 and 172 as described above. For example, the first and second electrode capping patterns 178a and 178b include a colored non-photosensitive polymeric material.

In some embodiments, the upper surfaces of the first and second electrode capping patterns 178a and 178b are at substantially the same height as that of upper surfaces of the capping patterns 170 and 172.

A third electrode 190 can extend through a via insulation layer 180 and the second electrode capping pattern 178b to be electrically connected to the second electrode 155a.

FIGS. 10 to 24 are top plan views and cross-sectional views illustrating a method of manufacturing a display substrate in accordance with example embodiments. For example, FIGS. 10 to 24 illustrate a method of manufacturing the display substrate illustrated in FIGS. 4 to 6.

Figure 10:
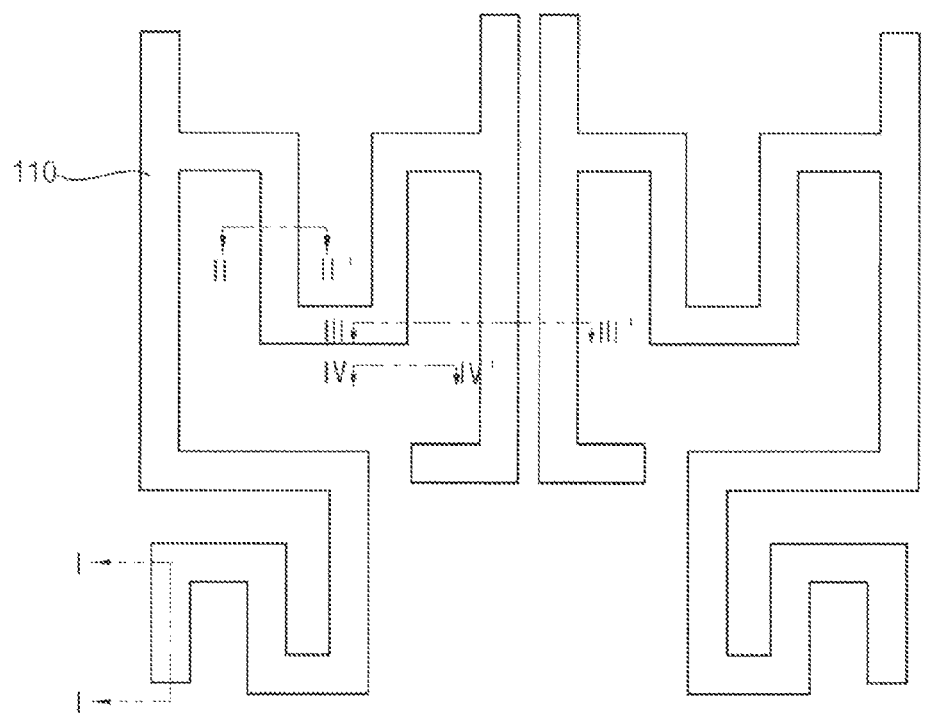
FIGS. 10 to 24 are top plan views and cross-sectional views illustrating a method of manufacturing a display substrate in accordance with example embodiments.
Figure 10:
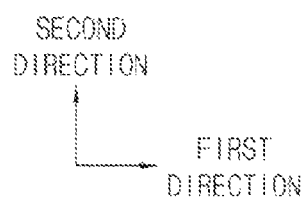
Figure 12:
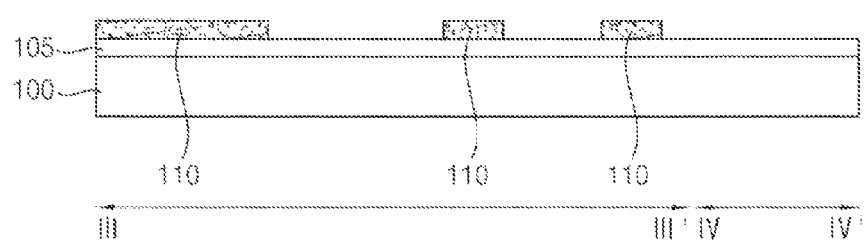
Figure 13:
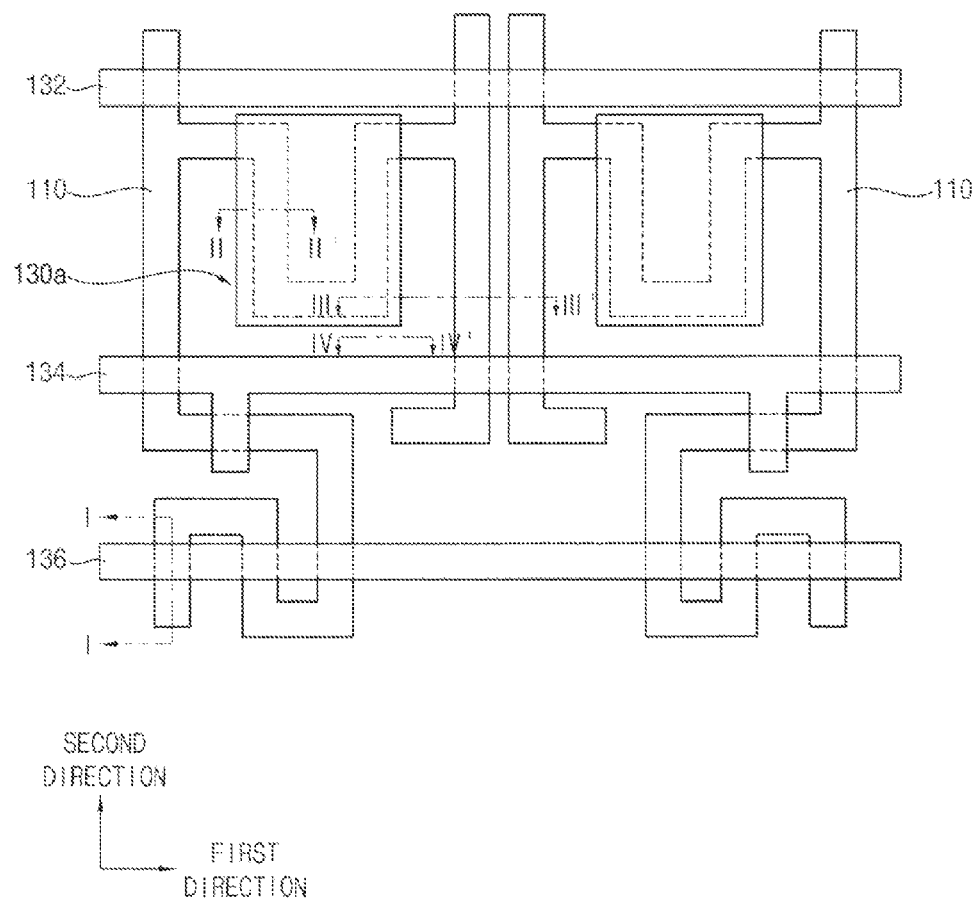
Figure 15:
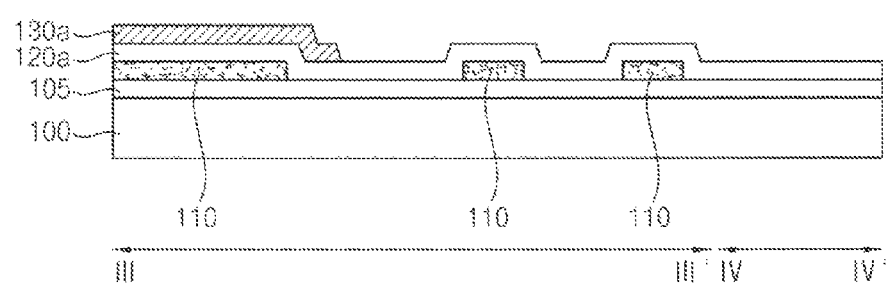
Figure 16:
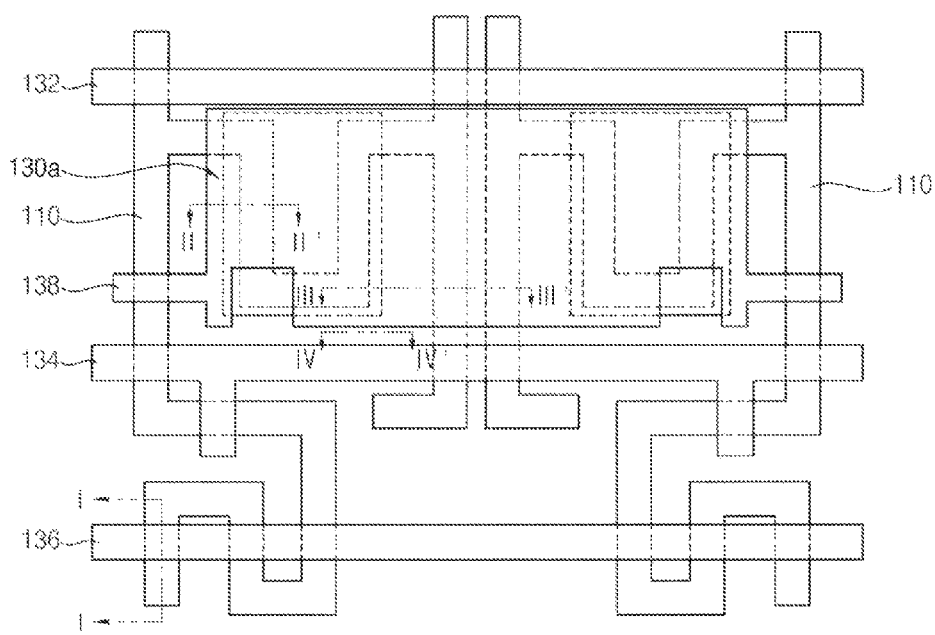
Figure 16:

Specifically, FIGS. 10, 13 and 16 are top plan views illustrating stages of the method. For convenience of descriptions, an illustration of insulative structures is omitted in FIGS. 10, 13 and 16. FIGS. 11, 14, 17, 19 and 24 include cross-sectional views taken along lines I-I' and II-II' indicated in the top plan views. FIGS. 12, 15, 18 and 20 to 23 include cross-sectional views taken along lines III-III' and IV-IV' indicated in the top plan views.

Figure 11:
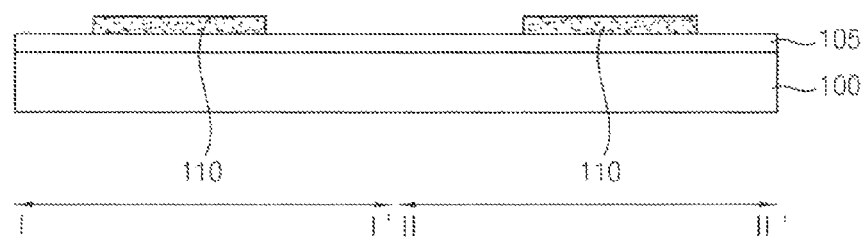

Referring to FIGS. 10 to 12, a barrier layer 105 is formed on a barrier substrate 100, and an active pattern 110 is formed on the barrier layer 105.

A glass substrate or a plastic substrate can be used as the base substrate 100. In some embodiments, the base substrate 100 is formed of a polymeric material having transparent and flexible properties.

The barrier layer 105 can cover an entire upper surface of the base substrate 100. The barrier layer 105 can be formed of silicon oxide, silicon nitride and/or silicon oxynitride.

A semiconductor layer can be formed of, e.g., amorphous silicon or polysilicon on the barrier layer 105, and then the semiconductor layer can be patterned to form an active pattern 110.

In some embodiments, after forming the semiconductor layer, a crystallization process such as a low temperature polycrystalline silicon (LTPS) process or a laser crystallization process can be further performed on the semiconductor layer.

In some embodiments, the semiconductor layer is formed of an oxide semiconductor such as IGZO, ZTO or ITZO.

As illustrated in FIG. 10, the active pattern 110 is patterned to be repeatedly arranged per each pixel.

Figure 14:
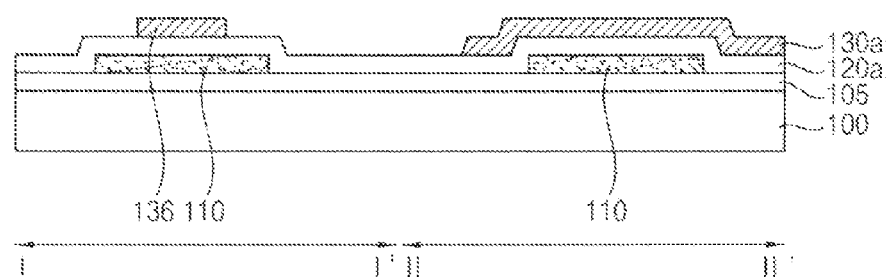

Referring to FIGS. 13 to 15, a first gate insulation layer 120a is formed on the barrier layer 105 to cover the active pattern 110. A first gate electrode 130a, and gate lines 132, 134 and 136 can be formed on the first gate insulation layer 120a.

The first gate insulation layer 120a can be formed conformally along surfaces of the barrier layer 105 and the active pattern 110. The first gate insulation layer 120a can include a protrusion on the active pattern 110. The first gate insulation layer 120a can be formed of silicon oxide, silicon nitride and/or silicon oxynitride.

A first conductive layer can be formed on the first gate insulation layer 120a, and then can be patterned to form the first gate electrode 130a, and the gate lines 132, 134 and 136. The first conductive layer can be formed of a metal, an ally or a metal nitride. The first conductive layer can be formed to include a plurality of metal layers.

The first gate electrode 130a can be patterned to have a plate shape overlapping a region of the active pattern 110. The gate lines 132, 134 and 136 can be patterned to extend in the first direction.

For example, the first gate line 132 serves as an emitting control line, and the second and third gate lines 134 and 136 serve as scan lines.

In some embodiments, after forming the first gate electrode 130a and the gate lines 132, 134 and 136, P-type or N-type impurities are doped in the active pattern 110 by an ion-implantation process. For example, the first gate electrode 130a, and the gate lines 132, 134 and 136 are utilized as an ion-implantation mask during the ion-implantation process. Thus, impurity regions can be formed at portions of the active pattern 110 which may not overlap the first gate electrode 130a, and the gate lines 132, 134 and 136 to provide a desired conductivity.

As describe with reference to FIG. 1 or FIG. 4, transistors are defined by overlapping areas of the active pattern 110 and the first gate electrode 130a, and overlapping areas of the active pattern 110 and the gate lines 132, 134 and 136.

Figure 17:
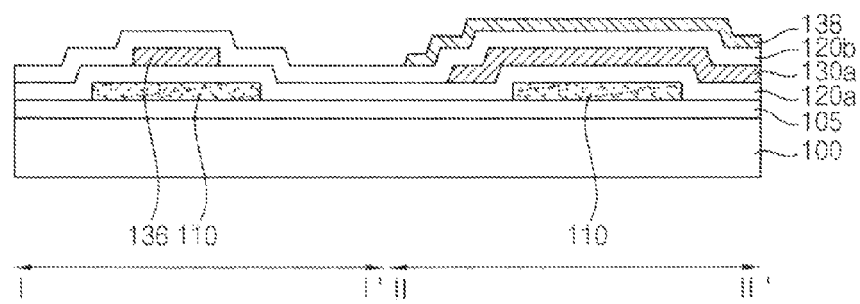
Figure 18:
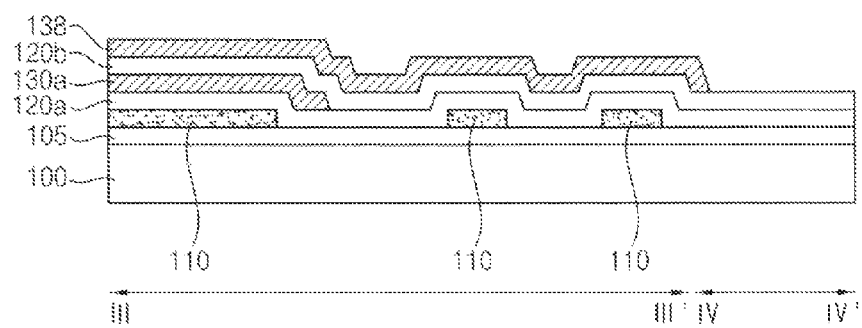

Referring to FIGS. 16 to 18, a second gate insulation layer 120b is formed on the first gate insulation layer 120a to cover the first gate electrode 130a, and the gate lines 132, 134 and 136. A second gate electrode 138 can be formed on the second gate insulation layer 120b.

The second gate insulation layer 120b can be formed conformally along surfaces of the first gate insulation layer 120a, the first gate electrode 130a, and the gate lines 132, 134 and 136. The second gate insulation layer 120b can include protrusions or stepped portions on the active pattern 110, the first gate electrode 130a, and the gate lines 132, 134 and 136. The second gate insulation layer 120b can be formed of silicon oxide, silicon nitride and/or silicon oxynitride.

For example, a second conductive layer is formed on the second gate insulation layer 120b, and the second conductive layer is patterned to form the second gate electrode 138. The second conductive layer can be formed of a metal, an alloy or a metal nitride. The second conductive layer can be formed to include a plurality of metal layers.

The second gate electrode 138 can overlap the first gate electrode 130a with respect to the second gate insulation layer 120b. The second gate electrode 138 can extend in the first direction, and can extend continuously over a plurality of pixels.

Figure 19:
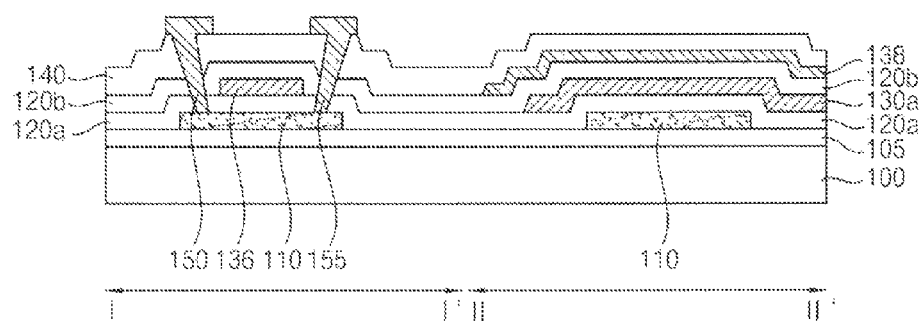
Figure 20:
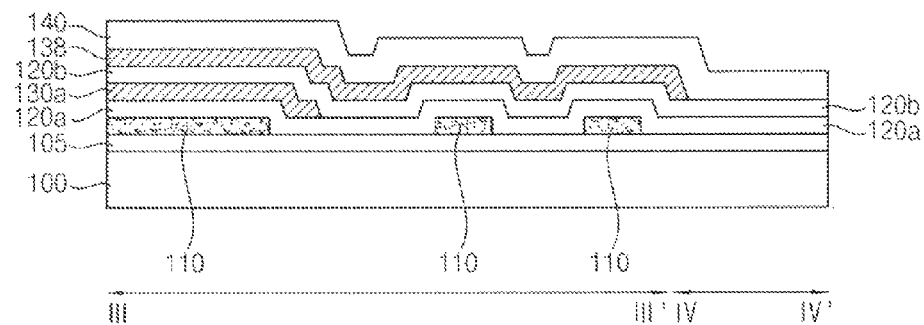

Referring to FIGS. 19 and 20, an insulating interlayer 140 is formed on the second gate insulation layer 120b to cover the second gate electrode 138. The insulating interlayer 140 can include stepped portions having different heights at areas overlapping the active pattern 110, the first and second gate electrodes 138 and 130a, and the gate lines 132, 134 and 136. The insulating interlayer 140 can be formed of silicon oxide, silicon nitride and/or silicon oxynitride.

Subsequently, a first electrode 150 and a second electrode 155 can be formed through the insulating interlayer 140, the second gate insulation layer 120b and the first gate insulation layer 120a to contact the active pattern 110 at both lateral regions of the third gate line 136.

For example, the insulating interlayer 140, the second gate insulation layer 120b and the first gate insulation layer 120a are partially etched to form contact holes through which the active pattern 110 is exposed at the both lateral regions of the third gate line 136. A third conductive layer filling the contact holes can be formed on the insulating interlayer 140, and can be patterned by a photo-lithography process to form the first electrode 150 and the second electrode 155. The third conductive layer can be formed of a metal, a metal nitride and/or an alloy.

In some embodiments, the first electrode 150 and the second electrode 155 serve as a source electrode and a drain electrode, respectively.

In some embodiments, the insulating interlayer 140 is formed to have a multi-layered structure. For example, a first insulating interlayer is formed on the second gate insulation layer 120b and the second gate electrode 138. The first electrode 150 and the second electrode 155 can be formed through the first insulating interlayer, the second gate insulation layer 120b and the first gate insulation layer 120a. A second insulating interlayer covering the first electrode 150 and the second electrode 155 can be formed on the first insulating interlayer.

Figure 21:
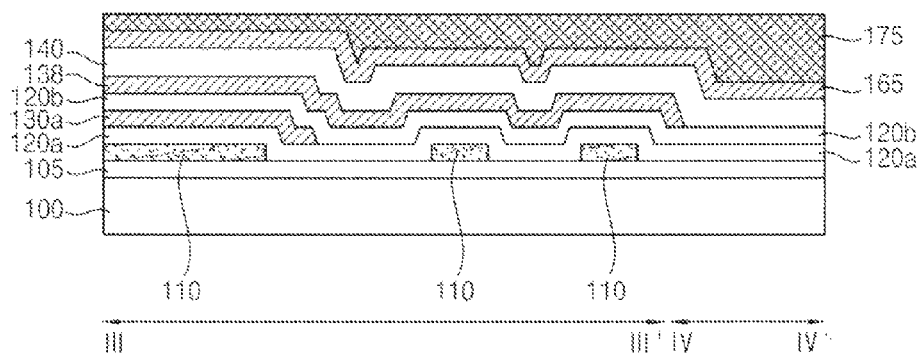

Referring to FIG. 21, a fourth conductive layer 165 is formed on the insulating interlayer 140, and a planarization layer 175 is formed on the fourth conductive layer 165.

The fourth conductive layer 165 can include upper surfaces or stepped portions having different heights. For example, a portion of the fourth conductive layer 165 formed on a stack structure including the active pattern 110, the first gate electrode 130a and the second gate electrode 138 have a relatively high upper surface, and have a relatively low upper surface on a stack structure from which the active pattern 110, the first gate electrode 130a and/or the second gate electrode 138 can be omitted. The fourth conductive layer 165 can be formed of, e.g., a metal, a metal nitride and/or an alloy.

The planarization layer 175 can entirely cover the fourth conductive layer, and the stepped portions included in the fourth conductive layer 165 can be substantially removed or planarized by the planarization layer 175. In example embodiments, the planarization layer 175 is formed of a colored polymeric material by a coating process such as a spin coating process.

In some embodiments, the planarization layer 175 is formed of a non-photosensitive polymeric material in which a colored material is dispersed or combined. For example, the non-photosensitive polymeric material does not contain a functional group having a reactivity during an exposure process (e.g., a protecting group or a leaving group) in a polymer back-bone structure.

The colored material can include a carbon-based material such as carbon black, or a light-absorbant dye material. In some embodiments, the dye material has an absorbance to a light having a wavelength in a range from about 300 nm to about 500 nm.

Figure 22:
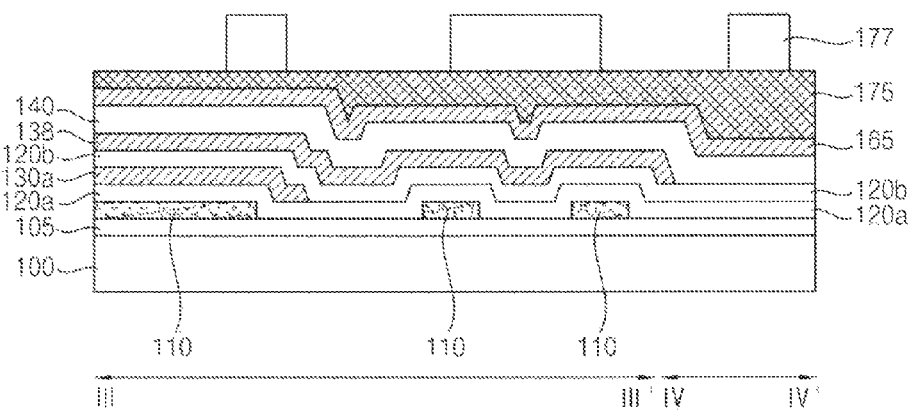

Referring to FIG. 22, a photoresist pattern 177 is formed on the planarization layer 175.

In example embodiments, a photoresist composition including a photoresist polymer is coated on the planarization layer 175 by a spin coating process to form a photoresist layer. An exposure process can be performed on the photoresist layer. For example, an exposed portion of the photoresist layer can be removed by a developing process to form the photoresist pattern 177.

The photoresist polymer can include a photosensitive polymer. For example, the photoresist polymer includes a repeating unit in a back-bone structure thereof. A leaving group or a protecting group that can participate in a photochemical reaction induced by the exposure process can be combined with the repeating unit.

The back-bone structure can include, e.g., novolac, polystyrene, polyhydroxystyrene (PHS), polyacrylate, polymethacrylate, polyvinyl ester, polyvinyl ether, polyolefin, polynorbornene, polyester, polyamide, polycarbonate, etc.

The photoresist composition can be a chemically amplified resist (CAR)-type composition. In this case, the photoresist composition can include a photoacid generator (PAG).

In some embodiments, an ultraviolet (UV) light source included Mine, G-line and/or H-line light sources is used in the exposure process. As described above, the planarization layer 175 can have an absorbance to a light having a wavelength in a range from about 300 nm to about 500 nm, so that a diffused reflection caused by irregular lower stack structures can be absorbed.

Additionally, the stepped portions of the fourth conductive layer 165 can be planarized or removed by the planarization layer 175, and thus the photoresist layer can be formed to have a substantially uniform thickness. Therefore, a distribution or a variation of an exposure amount caused by a thickness difference of the photoresist layer can be prevented or reduced.

Accordingly, the photoresist pattern 177 having desired or predetermined pitch and/or width can be achieved by absorbing an irregular reflected light and reducing the variation of the exposure amount.

Figure 23:
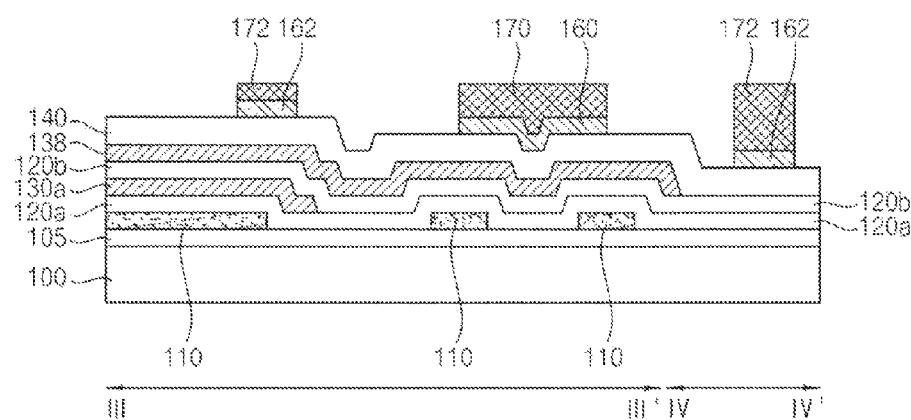

Referring to FIG. 23, the planarization layer 175 and the fourth conductive layer 165 are patterned using the photoresist pattern 177 as an etching mask. Accordingly, first and second wirings 160 and 162, and first and second capping patterns 170 and 172 can be formed on the insulating interlayer 140. The photoresist pattern 177 can be removed by, e.g., an ashing process and/or a strip process after forming the wirings and the capping patterns.

The first capping pattern 170 and the second capping pattern 172 can cover upper surfaces of the first wiring 160 and the second wiring 162, respectively, and can include upper surfaces at substantially the same height. Further, as illustrated in FIG. 4, a third wiring 164 is formed together with the first and second wirings 160 and 162, and a third capping pattern is formed on the third wiring 164.

In some example embodiments, as illustrated in FIG. 9, a first electrode capping pattern 178a and a second electrode capping pattern 178b covering upper surfaces of the first electrode 150 and the second electrode 155, respectively, are formed from the planarization layer together with the capping patterns. In some embodiments, the first electrode capping pattern 178a and the second electrode capping pattern 178b include upper surfaces having substantially the same height as that of upper surfaces of the capping patterns.

Figure 24:
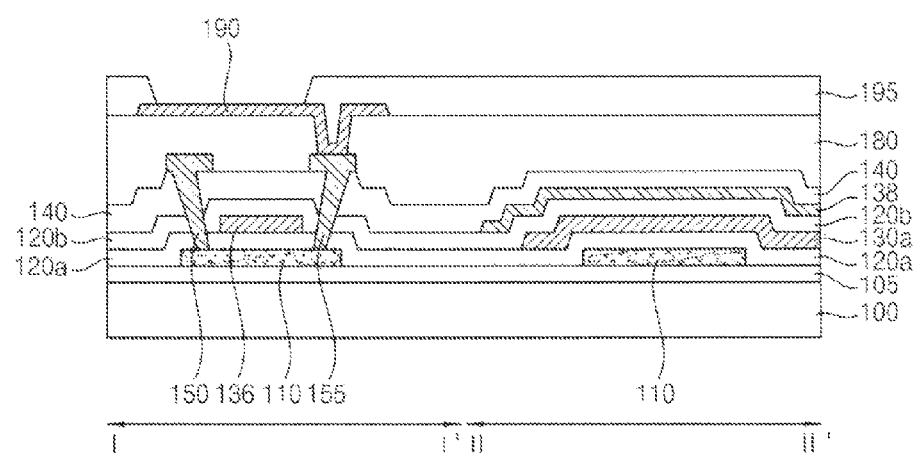

Referring to FIG. 24, a via insulation layer 180 is formed on the insulating interlayer 140 to cover the wirings and the capping patterns. For example, the via insulation layer 180 is formed of an organic polymeric material by a spin coating process, and has a substantially leveled or planar top surface.

The via insulation layer 180 can be partially etched to form a via hole through which the second electrode 155 can be exposed. A fifth conductive layer at least partially filling the via hole can be formed on the via insulation layer 180, and can be patterned to form a third electrode 190. The third electrode 190 can serve as, e.g., a pixel electrode or an anode. The fifth conductive layer can be formed of a metal, an alloy and/or a transparent conductive oxide.

A pixel defining layer 195 can be formed on the via insulation layer 180. The pixel defining layer 195 can cover a peripheral portion of the third electrode 190. For example, a photosensitive organic material including, e.g., a polyimide-based resin or an acryl-based resin can be coated on the via insulation layer 180, and then exposure and developing processes can be performed to form the pixel defining layer 195. In some embodiments, the pixel defining layer 195 is formed by a printing process such as an inkjet printing process using a polymeric material or an inorganic material.

The barrier layer 105, the semiconductor layer, the first and second gate insulation layers 120a and 120b, the first to fifth conductive layers and the insulating interlayer 140 can be formed by at least one of a chemical vapor deposition (CVD) process, a plasma enhanced chemical vapor deposition (PECVD) process, a high density plasma-chemical vapor deposition (HDP-CVD) process, a thermal evaporation process, a vacuum evaporation process, a spin coating process, a sputtering process, an atomic layer deposition: (ALD) process or a printing process.

Figure 25:
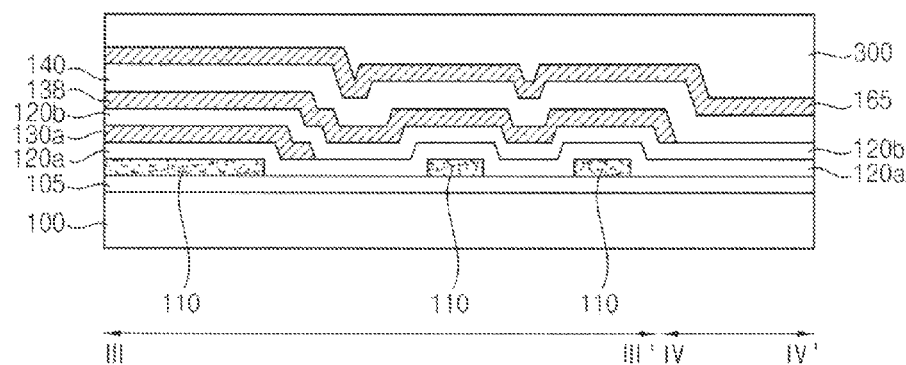
FIGS. 25 to 27 are cross-sectional views illustrating a method of forming a wiring in accordance with a comparative example.
Figure 26:
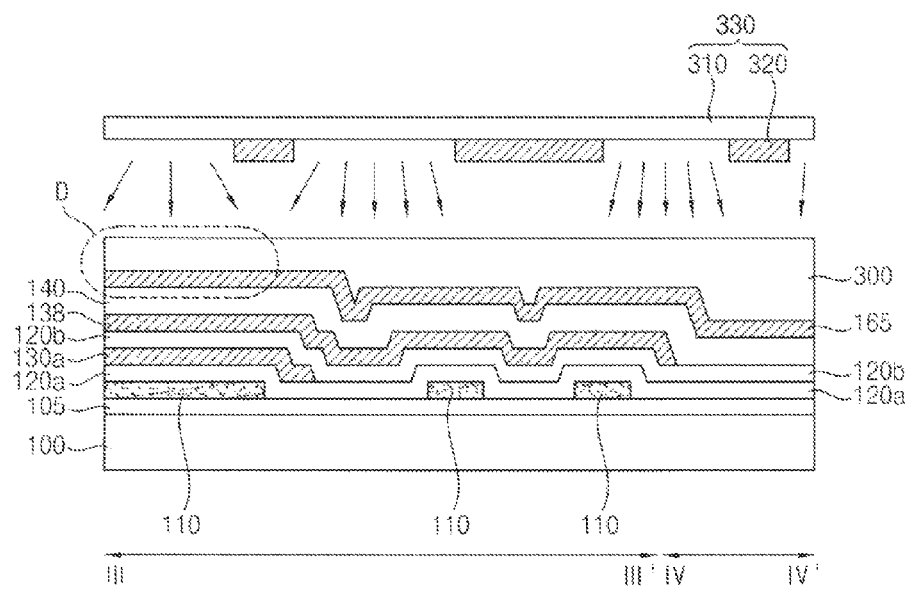
Figure 27:
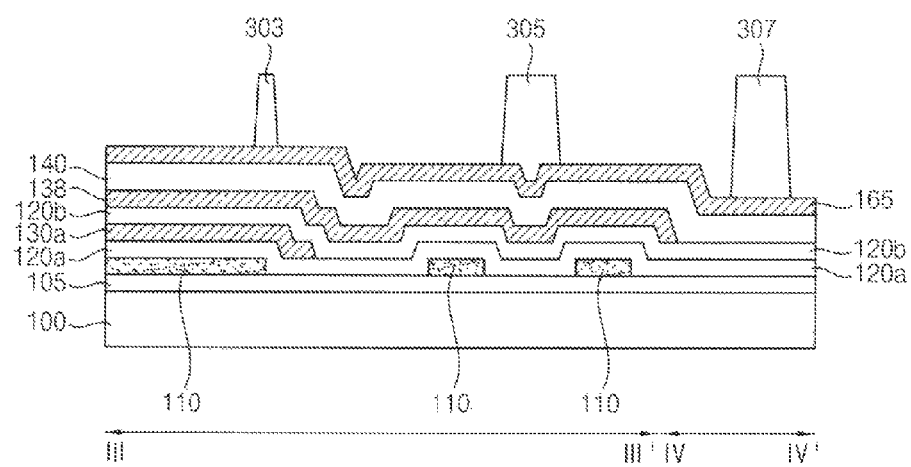

FIGS. 25 to 27 are cross-sectional views illustrating a method of forming a wiring in accordance with a comparative example.

Referring to FIG. 25, processes substantially the same as or similar to those illustrated with reference to FIGS. 10 to 20 can be performed. Accordingly, a barrier layer 105, an active pattern 110, a first gate insulation layer 120a, a first gate electrode 130a, a second gate insulation layer 120b, a second gate electrode 138 and an insulating interlayer 140 can be sequentially formed on a base substrate 100. A fourth conductive layer 165 for forming wirings can be formed on the insulating interlayer 140. In a comparative example, a photoresist layer 300 is formed directly on the fourth conductive layer 165 for a photo-lithography process with respect to the fourth conductive layer 165. A thickness of the photoresist layer 300 can be changed depending on a profile of a lower stack structure.

Referring to FIG. 26, an exposure process is performed on the photoresist layer 300. For example, an exposure mask 330 including a transparent substrate 310 and a light-shielding pattern 320 is placed. An exposure light can be irradiated through a portion of the transparent substrate 310 between the light-shielding patterns 320.

As illustrated in FIG. 26, the exposure light is scattered laterally at a relatively thick portion of the lower stack structure (e.g., an area designated as "D").

Referring to FIG. 27, exposed portions of the photoresist layer 300 is removed by a developing process to form first to third photoresist patterns 303, 305 and 307.

As described with reference to FIG. 26, the light is laterally scattered at the area "D," and thus the first photoresist pattern 303 has an excessively over-etched shape. As a result, a width of the first photoresist pattern 303 can be excessively reduced. Accordingly, a short-circuit can be caused, and a resistance of the wiring can be increased.

However, according to example embodiments as described above, the planarization layer 175 including a colored polymeric material is formed before forming the photoresist layer. Thus, stepped portions caused by the lower stack structure can be substantially removed or reduced so that the photoresist layer can have an entirely uniform thickness.

Therefore, a variation of an exposure amount caused by a thickness difference of the photoresist layer 300 occurring in the comparative example can be reduced, so that a photoresist pattern and a wiring having a desired fine dimension can be achieved.

Figure 28:
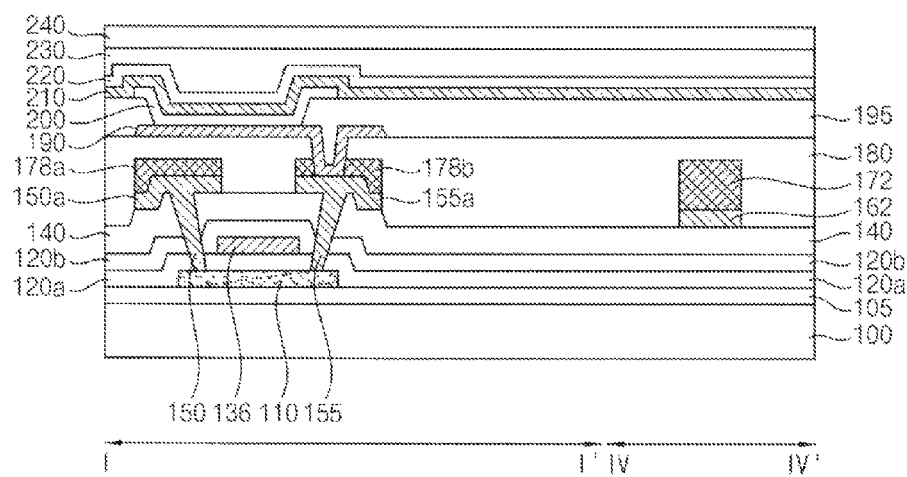
FIG. 28 is a cross-sectional view illustrating a display device in accordance with example embodiments.

FIG. 28 is a cross-sectional view illustrating a display device in accordance with example embodiments. For example, FIG. 28 illustrates an OLED including the display substrate according to example embodiments as described above. Detailed descriptions on elements and/or structures of the display substrate are omitted herein.

The display substrate in FIG. 28 is illustrated using cross-sectional views taken along lines I-I' and IV-IV' indicated in FIG. 1 or FIG. 4. For example, the display substrate can have a construction described with reference to FIG. 9.

As described above, the capping pattern (e.g., the second capping pattern 172) can be formed on the wiring (e.g., the second wiring 162). In some embodiments, the first electrode capping pattern 178a and the second electrode capping pattern 178b are formed on the first electrode 150a and the second electrode 155a, respectively.

In some embodiments, upper surfaces of the capping patterns, the first electrode capping pattern 178a and the second electrode capping pattern 178b are coplanar with one another.

The display device can further include a display layer 200, a fourth electrode 210, a passivation layer 220, a filling layer 230 and an encapsulation substrate 240 disposed on the display substrate.

The display layer 200 can be disposed on the pixel defining layer 195 and the third electrode 190. For example, the display layer is formed on a sidewall of the pixel defining layer 195, and a top surface of the third electrode 190 exposed through the pixel defining layer 195.

The display layer 200 can include an organic light emitting layer that can include light emitting materials for generating different colors of light, for example, a red color of light, a green color of light or a blue color of light. The light emitting material can include a host material excited by holes and electrons, and a dopant material for facilitating an absorbance and a release of energy and improving a light emitting efficiency. The display layer 200 can be individually patterned per each pixel.

In some embodiments, the display layer 200 further includes a hole transport layer (HTL) disposed between the third electrode 190 and the organic light emitting layer. The display layer 200 can further include an electron transport layer (ETL) disposed on the organic light emitting layer.

The HTL can include a hole transport material, for example, 4,4'-bis[N-(1-naphthyl)-N-phenylamino]biphenyl (NPB), 4,4'-bis[N-(3-methylphenyl)-N-phenylamino]biphenyl (TPD), N,N'-di-1-naphthyl-N,N'-diphenyl-1,1'-biphenyl-4,4'-diamine (NPD), N-phenylcarbazole, polyvinylcarbazole or a combination thereof.

The ETL can include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinazoline, or a combination thereof.

In some embodiments, at least one of the organic light emitting layer, the HTL or the ETL is not individually patterned per each pixel, and is commonly provided for a plurality of pixels. In an embodiment, the organic light emitting layer is provided for the pixels, and a color of each pixel is realized by a color filter. In this case, the display device can be a white-OLED (W-OLED) device.

In some embodiments, the display layer 200 includes a liquid crystal layer instead of the organic light emitting layer. In this case, the display device can be an LCD device.

The fourth electrode 210 can be disposed on the pixel defining layer 195 and the display layer 200. The fourth electrode 210 can serve as an opposing electrode that can face the third electrode 190 with respect to the display layer 200.

In example embodiments, the fourth electrode 210 serves as a common electrode continuously extending on the pixels. Further, the fourth electrode 210 can serve as a cathode of the display device.

For example, the fourth electrode 210 is formed of a metal such as Al, Ag, W, Cu, Ni, Cr, Mo, Ti, Pt, Ta, Nd or Sc, or an alloy thereof.

The passivation layer 220 can be formed on the fourth electrode 210. The passivation layer 220 can serve as a capping layer for protecting the fourth electrode 210 and the display layer 200.

The encapsulation substrate 240 can be disposed over the passivation layer 220, and the filling layer 230 can be interposed between the passivation layer 220 and the encapsulation substrate 240.

The encapsulation substrate 240 can include, e.g., a glass substrate or a polymer substrate. The filling layer 230 can include, e.g., an organic material having transmissive or transparent properties.

In some embodiments, an organic/inorganic hybrid film is utilized as a sealing film instead of the encapsulation substrate 240 and the filling layer 230. In some embodiments, a thin film encapsulation (TFE) film is utilized as the sealing film.

According to at least one of the disclosed embodiments, a conductive layer for forming wirings of a display substrate or a display device is formed, and a planarization layer and a photoresist layer is formed on the conductive layer. Step portions of the conductive layer can be planarized by the planarization layer. Thus, while performing a photo-lithography process on the photoresist layer, an irregular distribution of an exposure amount caused by the step portions can be reduced or avoided. Therefore, the wirings having desired fine dimensions can be formed from the conductive layer. Further, a capping pattern can be formed on the wiring from the planarization layer. A reflected light from the wiring can be absorbed by the capping pattern, and thus a display quality of the display device can be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display substrate, comprising:
   a base substrate;
   a stack structure over the base substrate, the stack structure including an active pattern, a gate electrode and a plurality of insulation layers;
   a plurality of wirings over the stack structure; and
   a plurality of colored capping patterns over respective ones of the wirings, wherein each of the wirings is in direct contact with each of the capping patterns.

2. The display substrate of claim 1, wherein the stack structure includes a plurality of stepped portions, and wherein the wirings include a plurality of upper surfaces having different heights from the base substrate.

3. The display substrate of claim 2, wherein the colored capping patterns respectively have a plurality of upper surfaces having the same distance from the base substrate.

4. The display substrate of claim 1, wherein the insulation layers include:
   a barrier layer over a top surface of the base substrate;
   a gate insulation layer over the barrier layer, the gate insulation layer covering the active pattern; and
   an insulating interlayer over the gate insulation layer, the insulating interlayer covering the gate electrode.

5. The display substrate of claim 4, wherein the gate electrode includes a first gate electrode and a second gate electrode overlapping each other in the depth dimension of the display substrate, and
   wherein the gate insulation layer includes:
      a first gate insulation layer interposed between the active pattern and the first gate electrode; and
      a second gate insulation layer interposed between the first gate electrode and the second gate electrode.

6. The display substrate of claim 5, wherein a plurality of portions of the wirings overlapping the active pattern, the first gate electrode and the second gate electrode in the depth dimension of the stack structure have an uppermost surface among a plurality of upper surfaces of the wirings.

7. The display substrate of claim 5, wherein a plurality of portions of the wirings, overlapping the stack structure from which the active pattern, the first gate electrode and the second gate electrode are omitted, have the lowermost ones among a plurality of upper surfaces of the wirings.

8. The display substrate of claim 4, further comprising a first electrode and a second electrode extending through the insulating interlayer and the gate insulation layer to contact the active pattern.

9. The display substrate of claim 8, further comprising a first electrode capping pattern and a second electrode capping pattern respectively disposed over the first electrode and the second electrode.

10. The display substrate of claim 9, wherein the first and second electrode capping patterns are formed of the same material as that of the colored capping patterns, and wherein a plurality of upper surfaces of the first and second electrode capping patterns have the same height as those of the colored capping patterns.

11. The display substrate of claim 8, further comprising:
   a via insulation layer over the insulating interlayer, the via insulation layer covering the first electrode and the second electrode;
   a third electrode over the via insulation layer, the third electrode electrically connected to the second electrode; and
   a pixel defining layer over the via insulation layer, the pixel defining layer partially covering the third electrode.

12. A display substrate comprising:
   a base substrate;
   a stack structure over the base substrate, the stack structure including an active pattern, a gate electrode and a plurality of insulation layers;
   a plurality of wirings over the stack structure; and
   a plurality of colored capping patterns over respective ones of the wirings,
   wherein the colored capping patterns are formed of a non-photosensitive polymer including a colored material.

13. The display substrate of claim 12, wherein the colored material includes a black material or a dye.

14. The display substrate of claim 13, wherein the dye is configured to absorb light having a wavelength in the range from about 300 nm to about 500 nm.

15. A display device, comprising:
   a base substrate;
   a stack structure over the base substrate, the stack structure including an active pattern, a gate electrode and a plurality of insulation layers;
   a plurality of wirings over the stack structure, the wirings including a plurality of upper surfaces that have different heights;
   a plurality of capping patterns over respective ones of the wirings, the capping patterns respectively including a plurality of upper surfaces having the same distance from the base substrate;
   a source electrode and a drain electrode extending through at least a portion of the insulation layers to be electrically connected to the active pattern;
   a pixel electrode electrically connected to the drain electrode;
   a display layer over the pixel electrode; and
   an opposing electrode facing the pixel electrode with respect to the display layer,
   wherein each of the wirings is in direct contact with each of the capping patterns.

16. The display device of claim 15, further comprising a plurality of gate lines respectively crossing the wirings, wherein the gate electrode includes a first gate electrode and a second gate electrode overlapping each other in the depth dimension of the display device.

17. The display device of claim 16, wherein each of the wirings includes a stepped portion based on a profile of the stack structure, and wherein each stepped portion is planarized by the capping patterns.

18. The display device of claim 15, wherein the capping patterns respectively have a plurality of upper surfaces equidistant from the base substrate.

19. The display device of claim 18, wherein the capping patterns respectively have a plurality of lower surfaces that are not equidistant from the base substrate.

20. The display device of claim 19, wherein at least two of the capping patterns have different thicknesses.

21. A display substrate comprising:
   a base substrate;
   a stack structure over the base substrate, the stack structure including an active pattern, a gate electrode and a plurality of insulation layers;
   a plurality of wirings over the stack structure, the wirings including a plurality of upper surfaces that have different heights; and a plurality of capping patterns over respective ones of the wirings, the capping patterns respectively including a plurality of upper surfaces having the same distance from the base substrate;

a source electrode and a drain electrode extending through at least a portion of the insulation layers to be electrically connected to the active pattern;

a pixel electrode electrically connected to the active patterns;

a display layer over the pixel electrode; and an opposing electrode facing the pixel electrode with respect to the display layer, wherein the capping patterns are formed of a colored non-photosensitive polymer.

22. The display device of claim 21, wherein the capping patterns include a dye or a black material.

* * * * *